United States Patent [19]

Paschke

[11] 4,174,251

[45] Nov. 13, 1979

[54] METHOD OF SELECTIVE GAS ETCHING ON A SILICON NITRIDE LAYER

[75] Inventor: Klaus Paschke, Denzlingen, Fed. Rep. of Germany

[73] Assignee: ITT Industries, Inc., New York, N.Y.

[21] Appl. No.: 856,446

[22] Filed: Dec. 1, 1977

[30] Foreign Application Priority Data

Dec. 23, 1976 [DE] Fed. Rep. of Germany ....... 2658448

[51] Int. Cl.² .................. H01L 21/306; C03C 15/00; C03C 25/06
[52] U.S. Cl. ................................. 156/643; 156/646; 156/651; 156/657
[58] Field of Search ............ 204/192 E, 192 EC, 164; 156/643, 646, 651, 657, 659

[56] References Cited

U.S. PATENT DOCUMENTS

| 3,795,557 | 3/1974 | Jacob | 156/646 |
| 4,028,155 | 6/1977 | Jacob | 156/643 |

OTHER PUBLICATIONS

IBM Technical Disclosure Bulletin, vol. 17, No. 7, Dec. 1974, Plasma Etching Process by H. A. Clark, p. 1955.

*Primary Examiner*—William A. Powell
*Attorney, Agent, or Firm*—John T. O'Halloran; Peter C. Van Der Sluys; Stephen B. Goldman

[57] ABSTRACT

The process of etching a silicon nitride layer disposed upon a silicon substrate is completed in two steps by using a gas atmosphere composed of changing portions of $CF_4$ and $O_2$.

4 Claims, 2 Drawing Figures

METHOD OF SELECTIVE GAS ETCHING ON A SILICON NITRIDE LAYER

BACKGROUND OF THE INVENTION

This relates to a method of selective gas etching of a silicon nitride layer deposited on a semiconductive body of silicon.

It is well known that silicon nitride layers are of significance to semiconductor devices. They are used for various purposes, for example, for masking, for surface passivation, for isolation purposes or for manufacturing planar structures. When using silicon nitride layers in manufacturing structures, it is often necessary to remove certain areas from layers deposited on the entire surface of the structures to expose the semiconductive material e.g. for planar diffusion or bonding (contacting) purposes. This, however, calls for new etching techniques because, on one hand, silicon nitride layers in a buffered hydrofluoric acid require extremely long etching times, thus causing the photoresist layers of the masks to become damaged and, on the other hand, because the etching times in a concentrated hydrofluoric acid are short, but the concentrated acid destroys the material of the photoresist layers. Another disadvantage is the undercutting of the silicon nitride layers in cases where these layers are deposited on silicon dioxide layers.

One possible way of solving these problems resides in the use of hot phosphoric acid, as is described in the "Journal of the Electrochemical Society," 1967, pp. 869 to 872. According to this publication it is proposed to use a silicon dioxide ($SiO_2$) etching mask. It is obvious that this process is expensive and circumstantial, and also the handling of boiling phosphoric acid is not unproblematic.

Recently a new etching technique has been introduced known as the so-called dry-etching technique. This comprises the gas etching of a silicon nitride layer in a plasma established by high-frequency glow discharge, with the advantage, besides the high etching rates, residing in that a photoresist layer can be used as the etch masking. According to U.S. Pat. No. 3,795,557, e.g. carbon tetra-fluoride as such or with the addition of oxygen is used as the gas atmosphere in which the silicon nitride layer is etched. When using the hitherto conventional gas mixtures, the direct etching of the silicon nitride layer without protecting the silicon surface of the semiconductor body lying therebelow, is not possible, because the difference between the etching rates of the silicon nitride and the silicon, in dependence upon the kind of gas mixture, is at about 1:3, so that the silicon also becomes etched. Attempts have been made to avoid this by depositing a silicon dioxide intermediate layer on the semiconductor surface for restricting the etching effect of the gas mixture. This measure, however, represents an additional step in the process and, consequently, does not contribute towards economizing the process.

In order to overcome this disadvantage it has already been proposed in the applicant's earlier German patent application No. P 26 14 977.9 to etch the silicon nitride layer in the reaction chamber of a high-frequency glow discharge with a power from 200 to 800 W in a gas mixture containing perfluoropropane as the fluorocarbon compound with the addition of a certain amount of oxygen by adjustment of a predetermined pressure. Perfluoropropane ($C_3F_8$), however, is difficult to obtain, is costly, and moreover, the etching rates for silicon nitride are relatively low when using $C_3F_8$.

As an inexpensively obtainable fluoride of carbon it is possible to use the aforementioned carbon tetrafluoride. This, however, then gives rise to the disadvantages mentioned hereinbefore in connection with this substance.

SUMMARY OF THE INVENTION

It is the object of the invention, therefore, to provide a method which, with the use of carbon tetrafluoride, permits a selective etching of silicon nitride layers deposited on a semiconductor body of silicon, without attacking the silicon.

According to a broad aspect of the invention there is provided "claim 1." A method of gas etching, a silicon nitride layer deposited on a semiconductor body of silicon comprising immercing said semiconductor body having said silicon nitride layer thereon in a plasma produced by way of high frequency glow discharge of a gas atmosphere containing carbon tetrafluoride and oxygen, wherein said etching is carried out in first and second stages.

The invention shows that when increasing the proportion of oxygen in a $CF_4/O_2$-mixture from 5 to 50 Vol. %, the etching rate for silicon nitride will show a five-fold rise with the etching rate ratio of silicon to $Si_3N_4$ being changed from 10:1 to 1:6. Accordingly, there will be obtained a high etching rate for silicon nitride and, at the same time, sufficiently different etching rates between silicon and silicon nitride safeguarding a selective etching of the latter.

One problem, however, is still seen in the high proportion of oxygen of about 50 Vol. % in the etching gas, because this causes a more rapid decomposition of the photoresist layer used as the etching mask.

According to a further feature of the present invention, however, this danger can be eliminated by performing the etching process in two steps. In so doing, there is proceeded in such a way that first of all there is carried out a preliminary etching with the carbon tetrafluoride being mixed with 0-6 Vol. % oxygen, preferably with 5 Vol. % oxygen. In this way an excessively high proportion of oxygen is avoided at the beginning of the etching process which, at a 50:50 ratio would still be increased owing to the fact that at the beginning of the process particularly much of the carbon tetrafluoride is taken out of the etching gas. This preliminary etching process is then followed by the actual etching process during which the carbon tetrafluoride is mixed with 50 Vol. % oxygen.

The above and other objects of the present invention will be more clearly understood from the following detailed description taken in conjunction with the accompanying drawings in which:

DESCRIPTION OF THE PREFERRED EMBODIMENT

Figure 1:
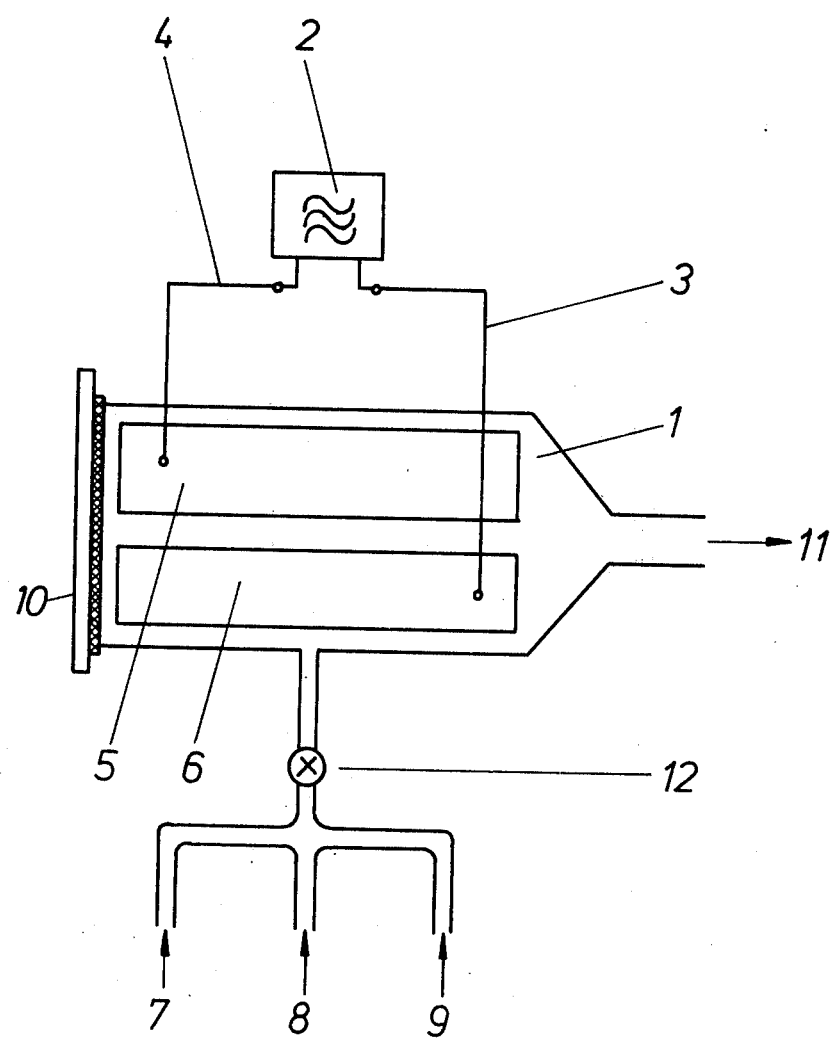
FIG. 1 is a schematic view of the arrangement for carrying out the etching process.

The method according to the invention employs a reaction chamber shown in FIG. 1, which is more fully described in the applicant's earlier German patent application No. P 26 14 977.9. In so doing, the semiconductor wafer as provided with the etch masking layer, on which a silicon nitride layer has been deposited, is inserted into the reaction chamber after the cover (lock) 10 has been removed. As a rule, in practically performing the method, a whole series of wafers is placed on to a glass support. In the course of this, it has proved to be of advantage to still surround the glass support and the semiconductor wafers thereon with a perforated etching tunnel of aluminum. After the cover 10 has been closed, the reaction chamber 1 is evacuated and the gas mixture in its already adjusted mixing proportion, is led into the reaction chamber by flowing through the conduits 7, 8, 9 following the opening of the valve 12. Through the same conduits provided with flowmeters there may also be fed in a protective or cleansing gas. At the outlet 11 the pressure inside the reaction chamber 1 is adjusted to values ranging between 0.5 and 1.5 Torr, preferably to 1.1 Torr with the aid of a vacuum pump and a throttle valve. High-frequency energy as generated in the high frequency generator 2 is then applied capacitively from the outside of the reaction chamber via electrical leads 3 and 4 to the electrodes 5 and 6, thus producing the plasma. These electrodes may have the shape of plates, but preferably they are designed in such a way as to surround the interior space of the chamber in a tunnel-like manner, into which there is inserted the etching tunnel together with the wafers to be etched. During the pre-etching stage the energy applied is between 300 and 800 W, preferably at about 600 W, and during the main etching stage this energy ranges between 100 and 400 W, and is preferably at about 300 W.

Typical etching conditions relating to a silicon nitride layer produced by chemical vapor deposition, and having a thickness of approximately 1,200 Å, are as follows:

|  | Etching Time | Etching Gas | Pressure inside Chamber | High-Frequency Power |
|---|---|---|---|---|
| Pre-Etching: | 0.2' | $CF_4$ + 5 Vol. % $O_2$ | 1.1 Torr | 600 W |
| Main Etching: | 1.5' | $CF_4$ + 50 Vol. % $O_2$ | 1.1 Torr | 300 W |

For silicon nitride, the etch rate thus amounts to 1,000 Å/min. as compared with 100 to 600 Å/min. in the method disclosed by the German patent application No. P 26 14 977.9.

Figure 2:
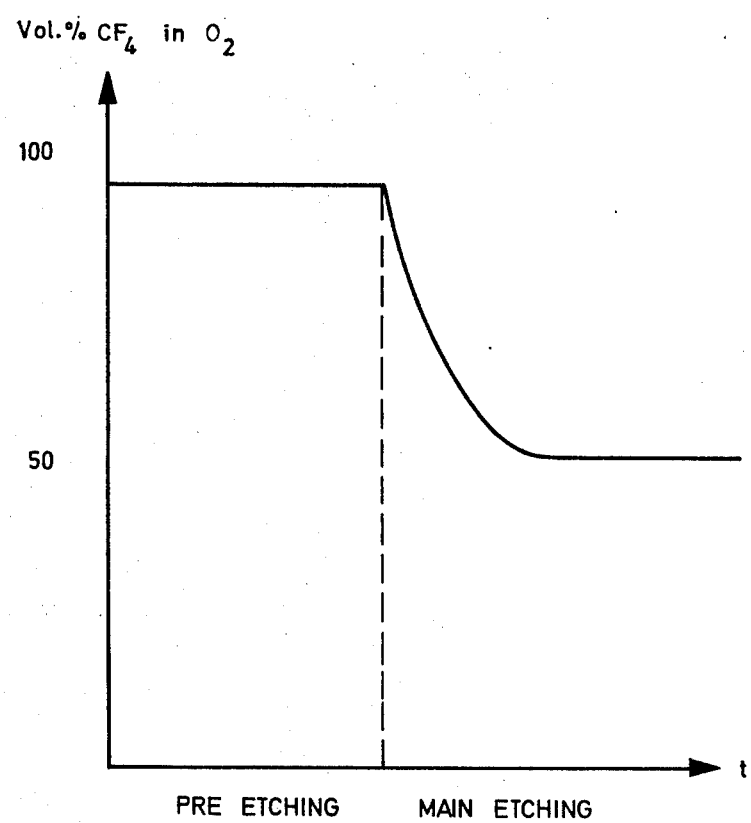
FIG. 2 shows a general diagram in which the composition of the gas mixture is plotted as a function of time.

The general diagram of FIG. 2 shows the gas distribution during both the pre-etching and the main etching stages. If the main etching were started with at once, that is, with a 50:50 gas mixture $CF_4$ to $O_2$, the actually already high contents of oxygen, as already mentioned hereinbefore, would still be increased by the initially increased consumption of $CF_4$. According to the invention, this is avoided by a pre-etching stage in which the ratio of $CF_4$: $O_2$ is at 95:5. Under such conditions of concentration an initially increased consumption of $CF_4$ is not strongly noticeable. During the pre-etching stage approximately 50% of the silicon nitride layer to be carried away, is removed. When changing over now to the main-etching stage, the gas concentrations in the existing mixture will not suffer an abrupt changeover, but incidentally there is effected a gradual drooping and adjusting to the 1:1 ratio of $CF_4$: $O_2$ as is illustrated by the curve shown in FIG. 2, because at present a higher proportion of $CF_4$ still resulting from the pre-etching stage, exists in the gas room. In this way the photoresist layer is prevented from being destroyed, and at the same time it is possible to achieve acceptable etching rates.

I claim:

1. A method of gas etching a silicon nitride layer deposited on a semiconductor body of silicon by immercing said semiconductor body having said silicon nitride layer thereon in a plasma produced by way of high frequency glow discharge of a glass atmosphere containing carbon tetrafluoride and oxygen, the improvement comprising:
   etching in a first stage at a first oxygen concentration and at a first high frequency power range; and
   etching in a second stage at a second oxygen concentration and at a second high frequency power range, wherein the first oxygen concentration is lower than the second oxygen concentration.

2. The method of gas etching a silicon nitride layer as set forth in claim 1, wherein said first stage is a pre-etching stage wherein a first concentration of 0–6 Vol. % oxygen is mixed to the carbon tetrafluoride, and wherein said second stage is a main etching stage wherein a second concentration of 50 Vol. % oxygen is mixed with the carbon tetrafluoride.

3. The method of gas etching a silicon nitride layer as set forth in claim 2, wherein said etching process is carried out under a pressure ranging between 0.5 and 1.5 torr, and wherein a first high frequency power of 300–800 W is applied during said pre-etching stage, and a second high frequency power of 100–400 W is applied during said main etching stage.

4. A method of etching a silicon nitride layer deposited on a semiconductor body of silicon wherein said silicon nitride layer is exposed to a plasma produced by way of a high frequency glow discharge of a gas containing carbon tetrafluoride and oxygen, the improvement comprising:
   pre-etching the silicon nitride layer wherein 0–6 Vol. % oxygen is mixed to the carbon tetrafluoride at a total pressure between 0.5 and 1.5 torr and at a frequency power of 300–800 watts; and
   main etching the silicon nitride layer wherein 50 Vol. % oxygen is mixed to the carbon tetrafluoride at a total pressure between 0.5 and 1.5 torr and at a frequency power of 100–400 watts.

* * * * *